(12) United States Patent
Bai et al.

(10) Patent No.: US 11,456,386 B2
(45) Date of Patent: Sep. 27, 2022

(54) THIN FILM TRANSISTOR, MANUFACTURING METHOD THEREOF, ARRAY SUBSTRATE AND ELECTRONIC DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Nini Bai, Beijing (CN); Liangliang Liu, Beijing (CN); Liang Tang, Beijing (CN)

(73) Assignees: Ordos Yuansheng Optoelectronics Co., Ltd., Inner Mongolia (CN); Beijing BOE Technology Development Co., Ltd., Beijing (CN)

( * ) Notice: Subject to any disclaimer, the term of this patent is extended or adjusted under 35 U.S.C. 154(b) by 543 days.

(21) Appl. No.: 16/468,760

(22) PCT Filed: Dec. 14, 2018

(86) PCT No.: PCT/CN2018/121115
§ 371 (c)(1),
(2) Date: Jun. 12, 2019

(87) PCT Pub. No.: WO2019/165824
PCT Pub. Date: Sep. 6, 2019

(65) Prior Publication Data
US 2021/0359138 A1  Nov. 18, 2021

(30) Foreign Application Priority Data
Feb. 27, 2018  (CN) .......................... 201810163942.X

(51) Int. Cl.
*H01L 29/786* (2006.01)
*H01L 29/66* (2006.01)
*H01L 29/417* (2006.01)

(52) U.S. Cl.
CPC .. *H01L 29/78621* (2013.01); *H01L 29/41733* (2013.01); *H01L 29/66742* (2013.01); *H01L 29/78696* (2013.01)

(58) Field of Classification Search
CPC ......... H01L 29/78621; H01L 29/41733; H01L 29/66742; H01L 29/78696
(Continued)

(56) References Cited

U.S. PATENT DOCUMENTS

| 6,429,485 B1 | 8/2002 | Ha et al. |
| 6,706,544 B2 | 3/2004 | Yamazaki et al. |

(Continued)

FOREIGN PATENT DOCUMENTS

| CN | 1790164 A | 6/2006 |
| CN | 1910756 | 2/2007 |

(Continued)

OTHER PUBLICATIONS

Chinese Office Action dated May 21, 2020 corresponding to Chinese Patent Application No. 201810163942; 18 pages.
(Continued)

*Primary Examiner* — Tong-Ho Kim
(74) *Attorney, Agent, or Firm* — Leason Ellis LLP

(57) ABSTRACT

A thin film transistor, a manufacturing method thereof, an array substrate and an electronic device are disclosed. The manufacturing method of the thin film transistor includes: forming an active layer pattern on a base substrate; forming a gate insulating layer on the active layer pattern; the gate insulating layer includes a first portion, a second portion and a third portion, the third portion is on both sides of the first
(Continued)

portion, the second portion is between the first portion and the third portion on at least one side, and the thickness of the second portion is larger than that of the third portion.

20 Claims, 6 Drawing Sheets

(58) Field of Classification Search
USPC .......................................................... 257/288
See application file for complete search history.

(56) References Cited

U.S. PATENT DOCUMENTS

| | | | |
|---|---|---|---|
| 7,569,435 B2 | 8/2009 | Shannon et al. | |
| 2002/0036288 A1 | 3/2002 | Ohnuma | |
| 2004/0018670 A1 | 1/2004 | Arao et al. | |
| 2006/0076618 A1* | 4/2006 | Kang | H01L 27/12 |
| | | | 257/336 |
| 2006/0113597 A1* | 6/2006 | Ono | H01L 27/127 |
| | | | 257/347 |
| 2008/0179674 A1 | 7/2008 | Suzawa et al. | |
| 2014/0295627 A1* | 10/2014 | Sun | H01L 29/66757 |
| | | | 438/157 |
| 2017/0170202 A1 | 6/2017 | Guo et al. | |
| 2018/0108746 A1 | 4/2018 | Zhao et al. | |

FOREIGN PATENT DOCUMENTS

| | | |
|---|---|---|
| CN | 104409518 A | 3/2015 |
| CN | 104900712 A | 9/2015 |
| CN | 105870199 A | 8/2016 |
| CN | 106601822 A | 4/2017 |

OTHER PUBLICATIONS

International Search Report and Written Opinion in corresponding International Patent Application No. PCT/CN2018/121115 dated Mar. 15, 2019. 17 pages. (English translation attached.).
Extended European Search Report for corresponding European Application No. 18884848.5, dated Oct. 11, 2021. 7 pages.

* cited by examiner

THIN FILM TRANSISTOR, MANUFACTURING METHOD THEREOF, ARRAY SUBSTRATE AND ELECTRONIC DEVICE

CROSS-REFERENCE TO RELATED APPLICATIONS

This patent application is a U.S. National Stage Application under 35 U.S.C. § 371 of International Patent Application No. PCT/CN2018/121115, filed Dec. 14, 2018, which claims the priority of Chinese patent application No. 201810163942.X, entitled "THIN FILM TRANSISTOR AND MANUFACTURING METHOD THEREOF, ARRAY SUBSTRATE AND ELECTRONIC DEVICE", filed on Feb. 27, 2018, both of which are incorporated herein by reference in their entireties.

TECHNICAL FIELD

The embodiments of the present disclosure relate to a thin film transistor and a manufacturing method thereof, an array substrate and an electronic device.

BACKGROUND

In the field of display, thin film transistor (TFT), which is the key component of the industry, has attracted more and more attention. For example, a thin film transistor generally includes structures such as a gate electrode, a gate insulating layer, an active layer, a source electrode and a drain electrode.

Thin film transistor technology can be applied to various display devices, such as liquid crystal displays, organic light emitting diode displays, electronic paper displays and other display devices, and any product or component with display function including televisions, digital cameras, mobile phones, watches, tablet computers, notebook computers, navigators and the like. In a display device, a thin film transistor can act like a switch. For example, in an organic light emitting diode display, under the control of the gate electrode, an external data signal can be charged and discharged to a pixel electrode in the display device through a thin film transistor. In a display device, a thin film transistor, for example, usually has off-state leakage current, which will lead to charge loss from the corresponding pixel electrode.

SUMMARY

At least an embodiment of the present disclosure provides a thin film transistor, a manufacturing method thereof, an array substrate, and an electronic device.

At least an embodiment of the present disclosure provides a method for manufacturing a thin film transistor, which includes: forming an active layer pattern on a base substrate; forming a gate insulating layer on the active layer pattern, the gate insulating layer including a first portion, a second portion, and a third portion, the third portion being on both sides of the first portion, the second portion being between the first portion and the third portion on at least one side, the thickness of the second portion being greater than the thickness of the third portion.

In some embodiments of the present disclosure, the method further includes forming a gate electrode located on a side of the gate insulating layer far from the base substrate and performing an ion doping process on the active layer pattern using the gate electrode as a mask; orthogonal projections of the first portion, the second portion, and the third portion on the base substrate coincide with an orthogonal projection of the active layer pattern on the base substrate; the first portion coincides with the orthographic projection of the gate electrode on the base substrate; in the ion doping process, a part of the active layer pattern, an orthogonal projection of which on the base substrate coincides with the third portion, is converted into a source region and a drain region, and a part of the active layer pattern, an orthogonal projection of which on the base substrate coincides with the second portion, is converted into a lightly doped drain region.

In some embodiments of the present disclosure, the source region, drain region and lightly doped drain region are formed simultaneously in the ion doping process.

In some embodiments of the present disclosure, in the ion doping process, a part of the active layer pattern, an orthographic projection of which on the base substrate coincides with the first portion, forms a channel region.

In some embodiments of the present disclosure, the forming the gate insulating layer on the active layer pattern includes: forming a gate insulating layer film on the active layer pattern; and patterning the gate insulating layer film by a photolithography process to form the gate insulating layer including the first portion, the second portion, and the third portion.

In some embodiments of the present disclosure, the forming the gate insulating layer and the gate on the active layer pattern includes: forming a gate insulating layer film on the active layer pattern; forming the gate on the gate insulating film; and using the gate electrode as a mask, etching the gate insulating film to form the gate insulating layer including the first portion, the second portion, and the third portion.

In some embodiments of the present disclosure, the gate insulating film is etched using the gate electrode as a mask under a condition that a photoresist pattern for forming the gate electrode is retained on the gate electrode.

In some embodiments of the present disclosure, the gate electrode has a trapezoidal cross section.

In some embodiments of the present disclosure, the second portion includes a sloped portion that slopes from the first portion to the third portion.

In some embodiments of the present disclosure, the second portion includes a stepped portion extending from the first portion to the third portion.

In some embodiments of the present disclosure, a thickness of the second portion is less than or equal to a thickness of the first portion.

In some embodiments of the present disclosure, the method further includes: forming a source electrode which is electrically connected with the source region; and forming a drain electrode opposite to the source electrode and electrically connected to the drain region.

At least an embodiment of the present disclosure also provides a thin film transistor, including: a base substrate; an active layer structure located on the base substrate; a gate insulating layer on the active layer structure, the gate insulating layer including a first portion, a second portion, and a third portion, the third portion being on both sides of the first portion, the second portion being between the first portion and the third portion on at least one side, and a thickness of the second portion being greater than a thickness of the third portion.

In some embodiments of the present disclosure, orthographic projections of the first portion, the second portion, and the third portion on the base substrate coincide with an orthographic projection of the active layer structure on the base substrate.

In some embodiments of the present disclosure, the active layer structure includes a source region, a drain region, and a lightly doped drain region, the orthogonal projection of the source region and the drain region on the base substrate coincides with the orthogonal projection of the third portion on the base substrate, and the orthogonal projection of the lightly doped drain region on the base substrate coincides with the orthogonal projection of the second portion on the base substrate.

In some embodiments of the present disclosure, the thin film transistor further includes a gate electrode located on a side of the gate insulating layer far from the base substrate, the gate electrode coinciding with an orthographic projection of the first portion on the base substrate.

In some embodiments of the present disclosure, the gate electrode has a trapezoidal cross section.

In some embodiments of the present disclosure, the active layer structure further includes a channel region that coincides with an orthographic projection of the gate on the base substrate.

In some embodiments of the present disclosure, the second portion includes a sloped portion that slopes from the first portion to the third portion, or the second portion includes a stepped portion that extends from the first portion to the third portion.

In some embodiments of the present disclosure, a thickness of the second portion is less than or equal to a thickness of the first portion.

At least an embodiment of the present disclosure provides an array substrate including the thin film transistor of any embodiment of the present disclosure.

At least an embodiment of the present disclosure provides an electronic device including the thin film transistor of any embodiment of the present disclosure.

BRIEF DESCRIPTION OF THE DRAWINGS

In order to more clearly explain the technical scheme of the embodiments of the present disclosure, the following will briefly introduce the drawings of the embodiments. Obviously, the drawings in the following description only refer to some embodiments of the present disclosure, and not to the limitations of the present disclosure.

DETAILED DESCRIPTION

Figure 1A:
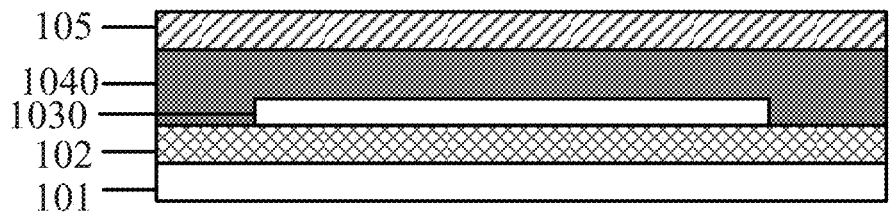
FIG. 1A to FIG. 1G show cross-sectional views of a thin film transistor provided according to an embodiment of the present disclosure in a manufacturing process.

In order to make objects, technical solutions and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

A thin film transistor usually includes a gate electrode, a source electrode, a drain electrode, a gate insulating layer, an active layer, and other structures. For example, the active layer structure generally includes components such as a source region, a drain region, and a channel region located between the source region and the drain region. An array substrate generally includes a plurality of sub-pixel units, and each sub-pixel unit generally includes at least one thin film transistor as a switching element. Thin film transistors usually suffer from undesirable off-state leakage current. For example, the off-state leakage current refers to the drain current that occurs after the TFT is turned off. Off-state leakage current is one of the major factors limiting the display effect of a display panel with higher resolution size.

Leakage current is a common undesirable phenomenon in an array substrate such as the array substrate with low temperature polysilicon thin film transistors. When a thin film transistor generates leakage current, the contrast ratio of a display device including an array substrate having the thin film transistor is usually lowered, thus being unfavorable to the display image quality of the display device. In order to effectively reduce the leakage current of the thin film transistor, for example, a lightly doped drain region may be provided between the source region and the channel region, or between the drain region and the channel region, in the active layer of the thin film transistor. The lightly doped drain region can prevent the electric field between the source region and the drain region from rapidly increasing, and can also suppress the hot carrier effect generated with the decrease of the length of the channel region, thus effectively reducing the leakage current phenomenon of the thin film transistor.

In order to form the lightly doped drain region in the active layer, the lightly doped drain region can be formed by adopting a mask for lightly doped drain and adding a process of exposure, development, etching, stripping and the like, but the method adds a mask process and thus increases the production costs. For example, in order to form a lightly doped drain region in the active layer, the lightly doped drain region can also be formed by using a gate electrode photoresist pattern as a mask on the basis of a gate mask, and the process steps can be sequentially as follows: gate film deposition→exposure→etching→primary ion implantation-→photoresist ashing→gate layer etching→photoresist stripping→secondary ion implantation→lightly doped drain region; but this process is complicated, the process time is long, and the production cost is relatively high.

At least an embodiment of the present disclosure provides a manufacturing method of a thin film transistor, comprising:

forming an active layer pattern on a base substrate;

forming a gate insulating layer and a gate electrode on the active layer pattern, in which the gate electrode is located on a side of the gate insulating layer far from the base substrate, the gate insulating layer includes an opposing portion directly opposite to the active layer pattern, the opposing portion includes a first portion, a second portion and a third portion, the first portion is opposite to the gate electrode, the third portion is on both sides of the first portion, the second portion is between the first portion and the third portion on at least one side, and the second portion is perpendicular to the base substrate; and performing an ion doping process on the active layer pattern by using the gate electrode as a mask, so that the part of the active layer pattern directly opposite to the third portion is converted into a source region and a drain region, and the part of the active layer pattern directly opposite to the second portion is converted into a lightly doped drain region.

For example, an ion doping process (IDP) may also be referred to as an ion implantation process (IIP). For example, an ion doping/implantation process refers to a process of implanting/doping ions into a film layer.

At least an embodiment of the present disclosure provides a method of manufacturing a thin film transistor, the method comprising: forming an active layer pattern on a base substrate; forming a gate insulating layer and a gate electrode on the active layer pattern, wherein the gate insulating layer comprises, on the active layer pattern, a first portion, a third portion on both sides of the first portion, and a second portion between the first portion and the third portion on at least one side, the thickness of the second portion is greater than that of the third portion, and the gate electrode overlaps with the first portion; and doping ion into the active layer using the gate electrode as a mask to form a channel region, a source region, a drain region and a lightly doped drain region in the active layer pattern. In the direction perpendicular to the base substrate, the lightly doped drain region overlaps with the second portion, and the source region and the drain region overlap with the third portion, and the lightly doped drain region is located between the source region and the channel region and/or the drain region and the channel region. The thickness refers, for example, to a dimension in the direction perpendicular to the base substrate. The thickness of the second portion is larger than the thickness of the third portion, for example, which means that the size of the second portion in the direction perpendicular to the base substrate is larger than the size of the third portion in the direction perpendicular to the base substrate.

In embodiments of the present disclosure, the thickness of an element/component may refer to the distance from the surface of the element/component close to the base substrate to the surface far from the base substrate.

For example, in the embodiments of the present disclosure, overlapping of two components in the direction perpendicular to the base substrate may refer to overlapping of the orthographic projections of the two components on the base substrate, for example, the orthographic projections of the two components on the base substrate completely overlap, but the embodiments are not limited thereto. For example, in the embodiments of the present disclosure, overlapping of two components in the direction perpendicular to the base substrate may mean that the orthographic projection of one component on the base substrate falls into the orthographic projection of the other component on the base substrate, and the orthographic projections of the two components on the base substrate have the same boundary, or the orthographic projections of the two components on the base substrate have the same outer edge.

In the manufacturing method of the thin film transistor provided by the above embodiments, the lightly doped drain region is formed in the active layer of the thin film transistor by designing the pattern of the gate insulating layer or further matching the depth adjustment of the ion implantation process, thereby effectively reducing the leakage current of the thin film transistor. The manufacturing method can simplify the process and reduce the production cost.

The following is a description of several specific examples. In order to keep the following description of embodiments of the present disclosure clear and concise, detailed descriptions of known functions and known components may be omitted.

An embodiment of the present disclosure provides a manufacturing method of a thin film transistor 100, and to FIG. 1A to FIG. 1G show cross-sectional views of the thin film transistor provided according to the embodiment in the manufacturing process. The manufacturing method of the thin film transistor provided according to this embodiment will be described in detail below with reference to FIG. 1A to FIG. 1G.

As shown in FIG. 1A, a base substrate 101 is first provided, which may be, for example, a glass substrate, a quartz substrate, a plastic substrate, or a base substrate of another suitable material.

As shown in FIG. 1A, for example, a buffer layer 102, an active layer pattern 1030, a gate insulating film 1040, and a gate metal layer 105 may be sequentially formed on the base substrate 101.

For example, after providing the base substrate 101, the buffer layer 102 may be formed on the base substrate 101. For example, the buffer layer 102 can prevent impurity ions in the base substrate 101 from diffusing into a circuit layer including a thin film transistor and the like formed later, and prevent influence on characteristics such as threshold voltage and leakage current of thin film transistor elements. At the same time, the buffer layer 102 can also planarize the surface of the base substrate 101. Examples of materials for the buffer layer 102 include SiNx, SiOx or other suitable materials, and the embodiments are not limited thereto.

As shown in FIG. 1A, after the buffer layer 102 is formed, an active layer film is formed on the buffer layer 102, and the active layer film is patterned by a patterning process to form an active layer pattern 1030. The active layer thin film includes, for example, an amorphous silicon layer. The active layer thin film may be deposited, for example, by a plasma enhanced chemical vapor deposition (PECVD) method, atmospheric pressure chemical vapor deposition (APCVD), or the like.

For example, forming of the amorphous silicon active layer pattern 1030 using a patterning process may include forming a photoresist layer (not shown) on the entire surface of the amorphous silicon layer after depositing the amorphous silicon layer on the buffer layer 102. The photoresist layer is patterned, by a photolithography process including an exposure process and a development process, to form a photoresist pattern having a shape corresponding to the active layer pattern 1030 of a desired shape on the amorphous silicon layer. Then, the amorphous silicon layer is patterned using the above photoresist pattern as an etching mask to form an active layer pattern 1030 on the buffer layer 102.

In this embodiment, examples of materials for the active layer pattern 1030 include amorphous silicon, polysilicon, metal oxide semiconductor materials such as Indium Gallium Zinc Oxide (IGZO) or any other suitable material.

When the active layer pattern 1030 is formed of polycrystalline silicon material, the method of forming the polycrystalline silicon active layer pattern 1030 may include: after depositing an amorphous silicon layer on the buffer layer 102, depositing an inducing metal layer by sputtering at a selected position on the amorphous silicon layer (usually at a source/drain region formed subsequent), and then performing an annealing treatment, such as rapid thermal annealing (RTA), excimer laser annealing (ELA), furnace annealing, or the like. In the annealing process, metal-induced crystallization (MIC) first occurs in the region where the amorphous silicon layer is in direct contact with the metal to form an MIC polycrystalline silicon region, and then polycrystalline silicon grains grow laterally into the amorphous silicon region where there is no direct contact with the metal to form metal-induced lateral crystallization (MILC) polycrystalline silicon region. In this way, the amorphous silicon layer is crystallized into a polysilicon layer. Then, a photoresist layer (not shown in the figure) is formed on the entire surface of the polysilicon layer, and the photoresist layer is patterned by a photolithography process including an exposure process and a development process to form a photoresist pattern having a shape corresponding to the active layer pattern 1030 of a desired shape on the polysilicon layer. Then, the polysilicon layer is patterned using the photoresist pattern as an etching mask to form a polysilicon active layer pattern 1030 on the buffer layer 102. Of course, the polysilicon active layer pattern 1030 can also be fabricated in other ways. For example, excimer laser annealing can be used to crystallize amorphous silicon into polysilicon, and a polysilicon active layer pattern can be formed through a patterning process.

As shown in FIG. 1A, a gate insulating film 1040 covering the active layer pattern 1030 is deposited on the active layer pattern 1030. The gate insulating layer film 1040 may be deposited by PECVD, APCVD, or the like, for example. Examples of materials for the gate insulating film 1040 include SiNx, SiOx, or other suitable materials, and this embodiment is not limited thereto.

After forming the gate insulating film 1040, a gate metal layer 105 is deposited on the gate insulating film 1040, and the gate metal layer 105 may be deposited by, for example, magnetron sputtering or the like. Examples of materials for the gate metal layer 105 include aluminum, aluminum alloy, copper, copper alloy or other suitable materials, and this embodiment is not limited thereto.

Figure 1B:
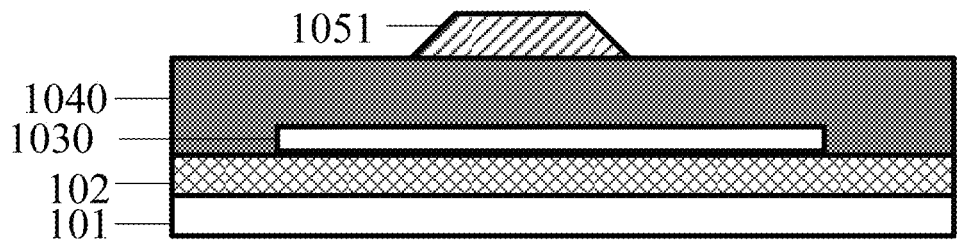

For example, as shown in FIG. 1B, forming of the gate electrode 1051 using a photolithography process may include forming a photoresist layer (not shown) on the entire surface of the gate metal layer 105 after depositing the gate metal layer 105 on the gate insulating layer film 1040. The photoresist layer is patterned by a photolithography process including an exposure process and a development process to form a photoresist pattern having a shape corresponding to the gate electrode 1051 of a desired shape on the gate insulating layer film 1040. Then, the gate metal layer 105 is patterned using the above photoresist pattern as an etching mask to form a gate electrode 1051 on the gate insulating layer film 1040. For example, as shown in FIG. 1B, the gate electrode 1051 has a trapezoidal cross section, and the long bottom edge of the trapezoid is closer to the base substrate 101 than the short bottom edge.

Figure 1C:
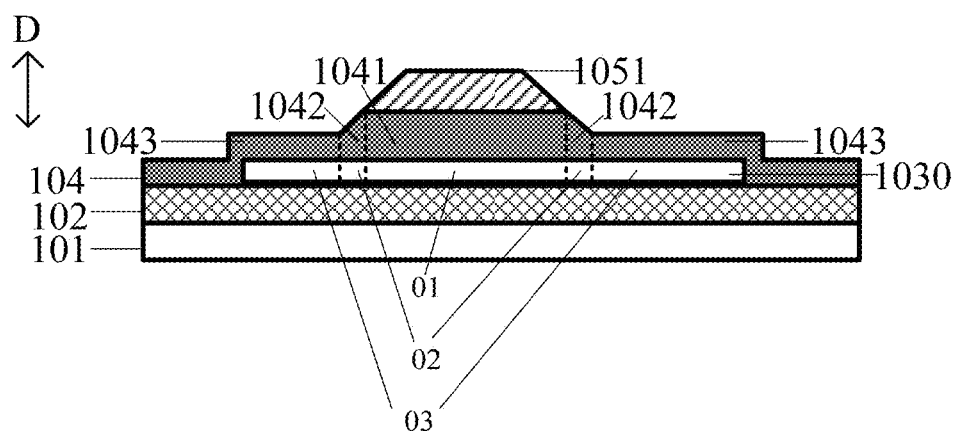

As shown in FIG. 1C, the photoresist pattern for forming the gate electrode 1051 is stripped off, and then the gate insulating layer film 1040 is etched using the gate electrode 1051 as a mask to form the gate insulating layer 104 on the active layer pattern 1030. The gate insulating layer 104 may include, for example, a first portion 1041, a third portion 1043 on both sides of the first portion 1041, and a second portion 1042 between the first portion 1041 and the third portion 1043 on at least one side. In this embodiment, the second portion 1042 is located between the first portion 1041 and the third portion 1043 on each side, that is, the second portion 1042 is located between the first portion 1041 and the third portion 1043 on both sides thereof. Of course, the positional relationship of the second portion 1042 is not limited to this case. For example, in another example of this embodiment, the second portion 1042 may be between the first portion 1041 and the third portion 1043 on one side of the first portion.

As shown in FIG. 1C, in the direction D perpendicular to the base substrate 101, the first portion 1041 overlaps with the gate electrode 1051, and the second portion 1042 is immediately adjacent to the side edge of the gate electrode 1051 and is shaped as a slope inclined from the first portion 1041 to the third portion 1043. For example, because the gate insulating layer 104 is patterned using the gate electrode 1051 as a mask, the slope angle of the second portion 1042 immediately adjacent to the side edge of the gate electrode 1051 may be substantially equal to the slope angle of the side edge of the gate electrode 1051. As shown in FIG. 1C, because the second portion 1042 is a slope portion having a slope and the third portion 1043 is a flat portion, the thickness of the formed second portion 1042 is larger than the thickness of the formed third portion 1043 under the same condition for etching the gate insulating layer film 1040. That is, the size of the second portion 1042 in the direction perpendicular to the base substrate 101 is larger than the size of the formed third portion 1043 in the direction perpendicular to the base substrate 101. In this embodiment, the etching method for the gate insulating layer 104 may be, for example, a dry etching method. The etching time, rate, and selection of etching gas can be adjusted according to the requirements of process design, and this embodiment is not limited to this.

Figure 1D:
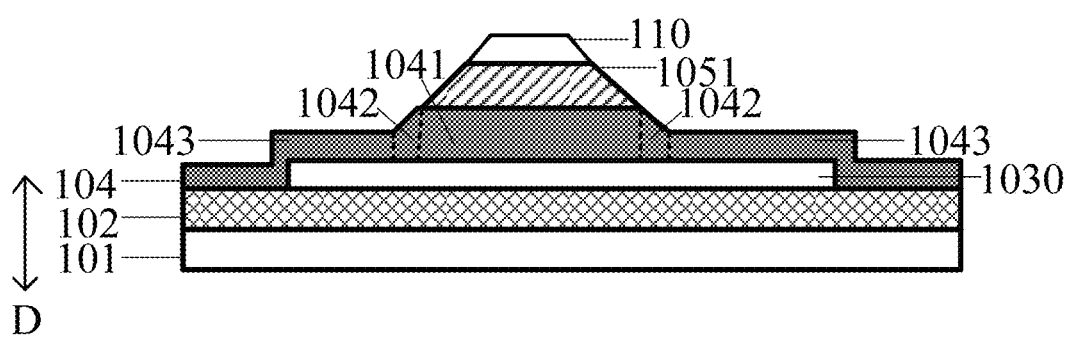

When forming the gate insulating layer 104, or as shown in FIG. 1D, the photoresist pattern 110 for forming the gate electrode 1051 is retained, the gate insulating layer film 1040 is etched using the photoresist pattern 110 and the gate electrode 1051 as masks together, and then the gate photoresist 110 is stripped off by a stripping process to form the gate insulating layer 104 including the first portion 1041, the second portion 1042, and the third portion 1043 on the active layer pattern 1030.

Figure 1E:
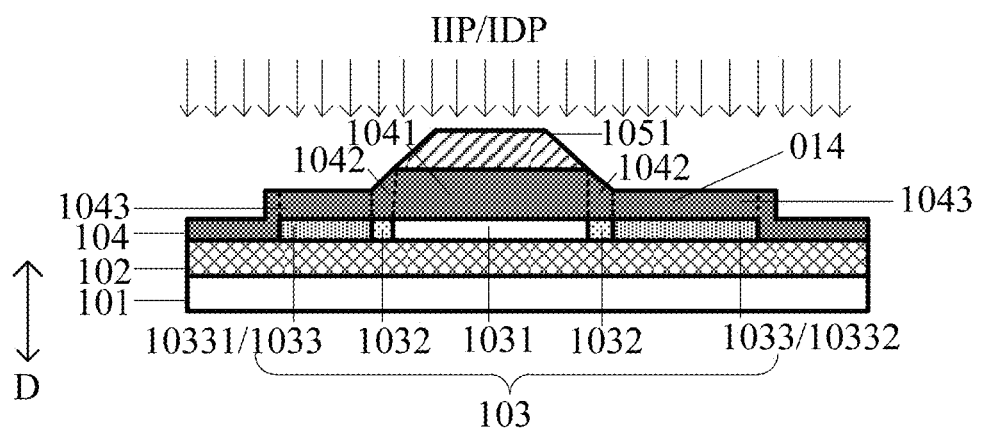

As shown in FIG. 1E, after the gate electrode 1051 and the gate insulating layer 104 are formed on the active layer pattern 1030, the active layer pattern 1030 is doped with ions by using the gate electrode 1051 as a mask to form a channel region 1031, a lightly doped drain region 1032, and a source/drain region 1033 within the active layer pattern 1030. For example, the source/drain region 1033 includes a source region 10331 and a drain region 10332. For example, as shown in FIG. 1E, the channel region 1031 overlaps the first portion 1041 of the gate insulating layer 104 and further overlaps the gate electrode 1051 in the direction D perpendicular to the base substrate 101. For example, as shown in FIG. 1E, the lightly doped drain region 1032 overlaps the second portion 1042 of the gate insulating layer 104 and is located between the source region 1033 and the channel region 1031 and between the drain region 1033 and the channel region 1031 in the direction perpendicular to the base substrate 101. For example, as shown in FIG. 1E, the source/drain region 1033 overlaps with the third portion 1043 of the gate insulating layer 104 in the direction perpendicular to the base substrate 101.

In the same doping process, that is, under the same doping conditions, the reasons that the lightly doped drain region 1032 and the source/drain region 1033 can be formed in the active layer pattern 1030 include, when the active layer pattern 1030 is doped with ions by using the gate electrode 1051 as a mask, because the size of the second portion 1042 of the gate insulating layer 104 below the gate electrode 1051 in the direction perpendicular to the base substrate 101 is larger than the size of the third portion 1043 in the direction perpendicular to the base substrate 101, the ion doping dose of the active layer pattern 1030 region overlapping the second portion 1042 will be smaller than the ion doping dose of the active layer pattern 1030 region overlapping the third portion 1043 under the same doping conditions. Moreover, by controlling the ion implantation dose and the ion implantation depth, for example, when the peak position of the ion implantation dose approaches the region of the active layer pattern 103 overlapping the third portion 1043, the peak value of the ion implantation dose in the region of the active layer pattern 103 overlapping the second portion 1042 is far from reaching the corresponding region. Therefore, a lightly doped drain region 1032 is formed in the region of the active layer pattern 103 overlapping the second portion 1042, and a source/drain region 1033 is formed in the region of the active layer pattern 103 overlapping the third portion 1043. Of course, the embodiment of the present disclosure is not limited to this example. For example, the lightly doped drain region 1032 may be formed when the peak position of the ion implantation dose has not reached the region of the active layer pattern 103 overlapping the third portion 1043 or slightly exceeds the region of the active layer pattern 103 overlapping the third portion 1043. Factors that affect the ion implantation depth include the ion type used for ion implantation, the implantation energy used, the material properties of the gate insulating layer, etc. For example, corresponding parameters can be obtained through tests.

It should be noted that in this embodiment, the lightly doped drain region 1032 does not mean absolute low-concentration ion doping, but compared with the ion doping concentration than the source/drain region 1033, the lightly doped drain region 1032 has a lower ion doping concentration than that of the source/drain region 1033. In this embodiment, ions used for doping include, for example, N-type ions or P-type ions, etc. as required. The lightly doped drain region 1032 is formed by the process method provided by the embodiment, the lightly doped drain region 1032 and the source/drain region 1033 can be simultaneously formed by only one ion implantation/doping process without separately designing a lightly doped drain region mask plate or realizing the lightly doped drain region by two ion implantation processes, thus simplifying the manufacturing process and reducing the production costs.

For example, as shown in FIG. 1E, the gate insulating layer 104 includes an opposing portion 014 directly opposite to the active layer pattern 1030. For example, the opposing portion 014 includes a first portion 1041, a second portion 1042, and a third portion 1043; the first portion 1041 is directly opposite to the gate electrode 1051, the third portion 1043 is on both sides of the first portion 1041, and the second portion 1042 is between the first portion 1041 and the third portion 1043 on at least one side.

For example, in the embodiments of the present disclosure, that two parts are directly opposite to each other means that one part is directly above the other part. For example, in the embodiments of the present disclosure, that the two components are directly opposite to each other means that the orthogonal projection of one component on the base substrate falls into the orthogonal projection of the other component on the base substrate, and the orthogonal projections of the two components on the base substrate have the same boundary, or the orthogonal projections of the two components on the base substrate have the same outer edge. For example, in the embodiments of the present disclosure, that the two components are directly opposite to each other means that, in the direction perpendicular to the base substrate, the two components completely overlap, but are not limited thereto.

For example, as shown in FIG. 1C and FIG. 1E, an ion doping process is performed on the active layer pattern 1030 using the gate electrode 1051 as a mask to convert the portion 03 of the active layer pattern 1030 directly opposite to the third portion 1043 into the source region 10331 and the drain region 10332, and to convert the portion 02 of the active layer pattern 1030 directly opposite to the second portion 1042 into the lightly doped drain region 1032.

In some embodiments of the present disclosure, the source region 10331, the drain region 10332, and the lightly doped drain region 1032 are simultaneously formed in same one ion doping process.

In some embodiments of the present disclosure, as shown in FIG. 1C and FIG. 1E, in the same ion doping process, the active layer pattern 1030 forms the channel region 1031 directly opposite to the portion 01 of the first portion 1041. The source region 10331 and the drain region 10332 are disposed on both sides of the channel region 1031 and separated by the channel region 1031.

As shown in FIG. 1E, after performing an ion doping process while forming the channel region 1031, the source region 10331, the drain region 10332, and the lightly doped drain region 1032, the active layer pattern 1030 is transformed into the active layer structure 103. The active layer structure 103 includes the source region 10331, the drain region 10332, the lightly doped drain region 1032, and the channel region 1031.

For example, as shown in FIG. 1E, the orthogonal projection of the source region 10331 and the drain region 10332 on the base substrate 101 coincides with the orthogonal projection of the third portion 1043 on the base substrate 101, and the orthogonal projection of the lightly doped drain region 1032 on the base substrate 101 coincides with the orthogonal projection of the second portion 1042 on the base substrate 101.

Figure 1F:
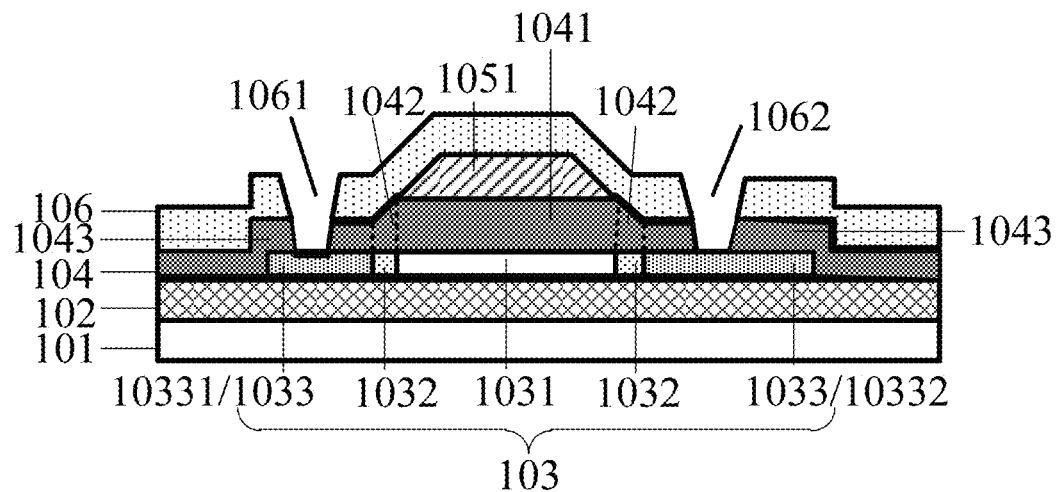

As shown in FIG. 1F, after forming the channel region 1031, the lightly doped drain region 1032, and the source/drain region 1033 in the active layer pattern 1030, an interlayer insulating film is formed on the gate electrode 1051, and the interlayer insulating film is patterned by a photolithography process to form the interlayer insulating layer 106. The interlayer insulating layer 106 has a via hole 1061 exposing the source region 10331 and a via hole 1062 exposing the drain region 10332. The interlayer insulating layer 106 covers the gate electrode 1051, the gate insulating layer 104, and the active layer structure 103. Examples of materials for the interlayer insulating layer 106 include SiNx, SiOx, or other suitable materials.

Figure 1G:
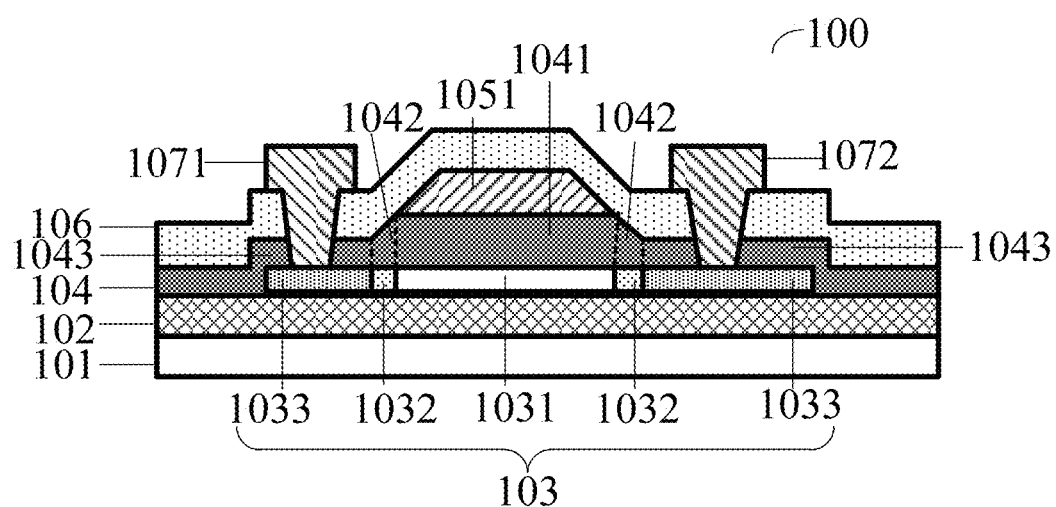

As shown in FIG. 1G, a source electrode 1071 and a drain electrode 1072 are formed on the interlayer insulating layer 106, the source electrode 1071 and the drain electrode 1072 are separated from each other, the source electrode 1071 is electrically connected to the source region 10331 of the active layer structure 103 through the via hole 1061, the drain electrode 1072 is formed opposite to the source electrode 1071 and is electrically connected to the drain region 10332 of the active layer structure 103 through the via hole 1062. Examples of materials for the source electrode 1071 and/or drain electrode 1072 include aluminum, aluminum alloy, copper, copper alloy, or other suitable materials.

In the thin film transistor 100 provided in this embodiment, the gate insulating layer 104 is formed using the gate electrode 1051 as a mask. The gate insulating layer 104 includes a first portion 1041, a second portion 1042, and a third portion 1043, and the size of the second portion 1042 in the direction perpendicular to the base substrate is larger than the size of the third portion 1043 in the direction perpendicular to the base substrate. At the same time, the lightly doped drain region 1032 and the source/drain region 1033 can be simultaneously formed in the thin film transistor under the same ion doping conditions in coordination with the depth adjustment of the ion implantation process. In the direction perpendicular to the base substrate, the lightly doped drain region 1032 overlaps the second portion 1042, and the source/drain region 1033 overlaps the third portion 1043. That is, the lightly doped drain region 1032 is directly opposite to the second portion 1042, and the source/drain region 1033 is directly opposite to the third portion 1043. Meanwhile, the channel region 1031 is directly opposite to the first portion 1041, and the first portion 1041 is directly opposite to the gate electrode 1051. The method provided by the embodiment forms the lightly doped drain region 1032 in the thin film transistor, thus simplifying the manufacturing process and reducing the production cost. Furthermore, by forming the lightly doped drain region 1032 in the thin film transistor 100, the leakage current of the thin film transistor is effectively reduced, thereby effectively improving the contrast of the array substrate including the thin film transistor as the switching element of a sub-pixel unit and improving the display quality of the array substrate.

In the embodiment of the present disclosure, that the two components/elements directly opposite to each other may means that the orthographic projections of the two components/elements on the base substrate are coincident with each other. For example, the lightly doped drain region 1032 coincides with the orthogonal projection of the second portion 1042 on the base substrate, the source/drain region 1033 coincides with the orthogonal projection of the third portion 1043 on the base substrate, the channel region 1031 coincides with the orthogonal projection of the first portion 1041 on the base substrate, and the first portion 1041 coincides with the orthogonal projection of the gate electrode 1051 on the base substrate.

Figure 2:
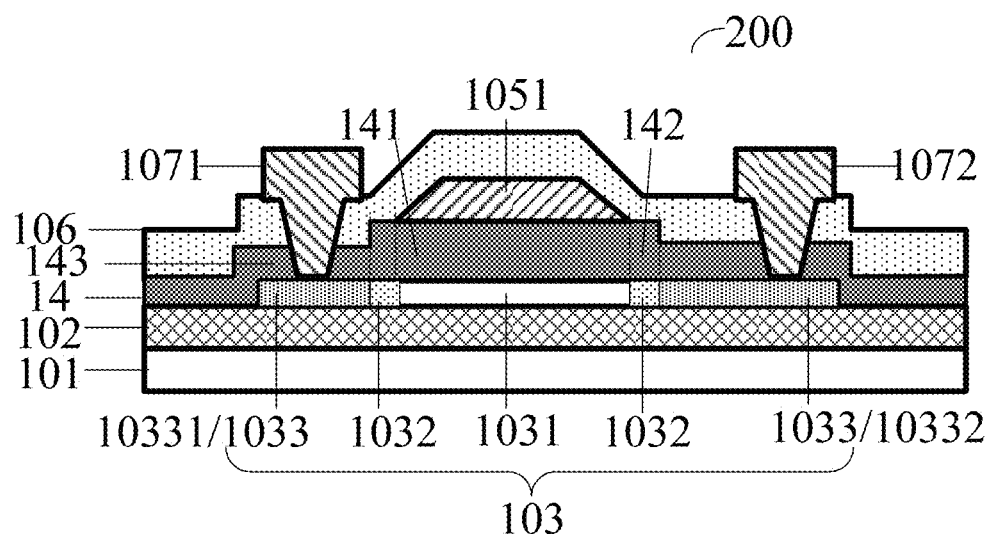
FIG. 2 shows a schematic cross-sectional structure of another thin film transistor provided according to an embodiment of the present disclosure.

FIG. 2 shows a schematic cross-sectional structure of a thin film transistor 200 fabricated by the fabrication method provided by another embodiment of the present disclosure.

FIG. 3A to FIG. 3F show cross-sectional views of the thin film transistor provided according to FIG. 2 in a manufacturing process.

Referring to FIG. 2 and FIG. 3A to FIG. 3F, the forming process of the thin film transistor of this embodiment is substantially the same as that of the thin film transistor described in FIG. 1A to FIG. 1G except for the shape and forming method of the gate insulating layer 104. Therefore, in this embodiment, the detailed forming process of the constituent elements having the same reference numerals as those in FIG. 1A to FIG. 1G will be based on the description of FIG. 1A to FIG. 1G, and different parts will be mainly discussed below.

Figure 3A:
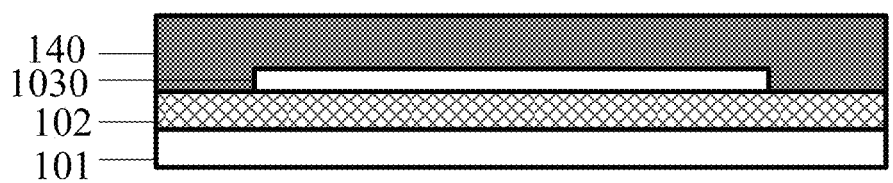
FIG. 3A to FIG. 3F show cross-sectional views of the thin film transistor provided according to FIG. 2 in a manufacturing process.

Referring to FIG. 3A, a base substrate 101 is first provided, which may be, for example, a glass substrate, a quartz substrate, a plastic substrate, or a base substrate of another suitable material. Then, a buffer layer 102, an active layer pattern 1030, and a gate insulating film 140 are sequentially formed on the base substrate 101. The respective formation methods of the buffer layer 102, the active layer pattern 1030, and the gate insulating layer film 140 may refer to the method described in FIG. 1A, for example, and will not be described again here.

Figure 3B:
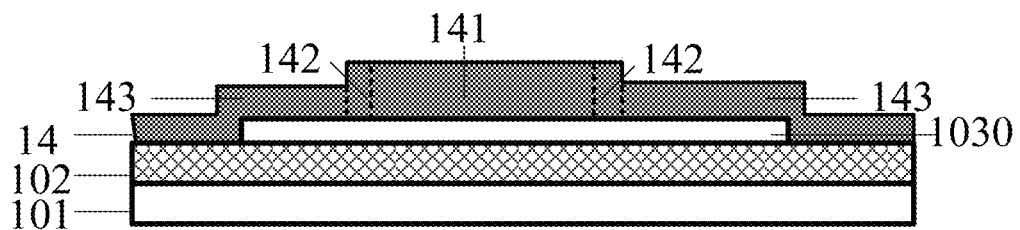

As shown in FIG. 3B, after forming the gate insulating layer film 14, the gate insulating layer film 140 is patterned by a photolithography process to form the gate insulating layer 14. The gate insulating layer 14 may include, for example, a first portion 141, a third portion 143 on both sides of the first portion 141, and a second portion 142 between the first portion 141 and the third portion 143 on at least one side. In this example, the second portion 142 is located between the first portion 141 and the third portion 143 on each side, that is, the second portion 142 is located between the first portion 141 and the third portion 143 on both sides of the first portion 141. Of course, the positional relationship of the second portion 142 is not limited to this. For example, in another example, the second portion 142 may also be between the first portion 141 and the third portion 143 on one side of the first portion.

As shown in FIG. 3B, the second portion 142 includes a stepped portion extending from the first portion 141 to the third portion 143, and the thickness of the formed second portion 142 is larger than the thickness of the formed third portion 143. That is, the size of the formed second portion 142 in the direction perpendicular to the base substrate is larger than the size of the formed third portion 143 in the direction perpendicular to the base substrate. In this embodiment, the etching method for the gate insulating layer 14 may be, for example, a dry etching method. Examples of the material of the gate insulating layer 14 include SiNx, SiOx or other suitable materials, and this embodiment is not limited thereto. For example, as shown in FIG. 3B, the size of the second portion 142 in the direction perpendicular to the base substrate is equal to the size of the first portion 141 in the direction perpendicular to the base substrate.

Figure 3C:
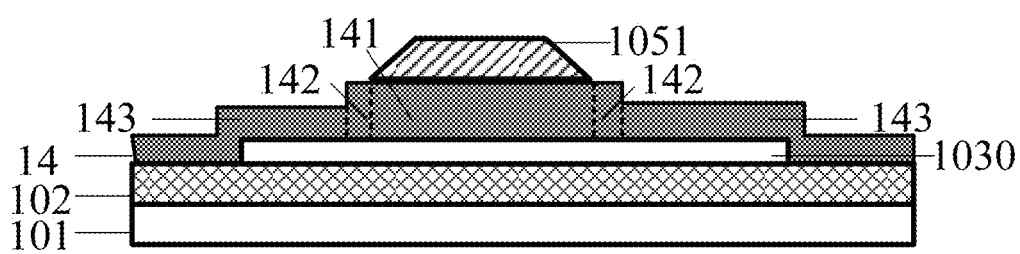

As shown in FIG. 3C, a gate metal layer (not shown) may be deposited on the gate insulating layer 14 by, for example, magnetron sputtering or the like, and patterned by a patterning process to form a gate electrode 1051. The gate electrode 1051 overlaps the first portion 141 of the gate insulating layer 14. For example, the gate electrode 1051 is located directly above the first portion 141 of the gate insulating layer 14. For example, the gate electrode 1051 is directly opposite to the first portion 141. Examples of materials for the gate electrode 1051 include aluminum, aluminum alloy, copper, copper alloy, or other suitable materials, and this embodiment is not limited thereto.

Figure 3D:
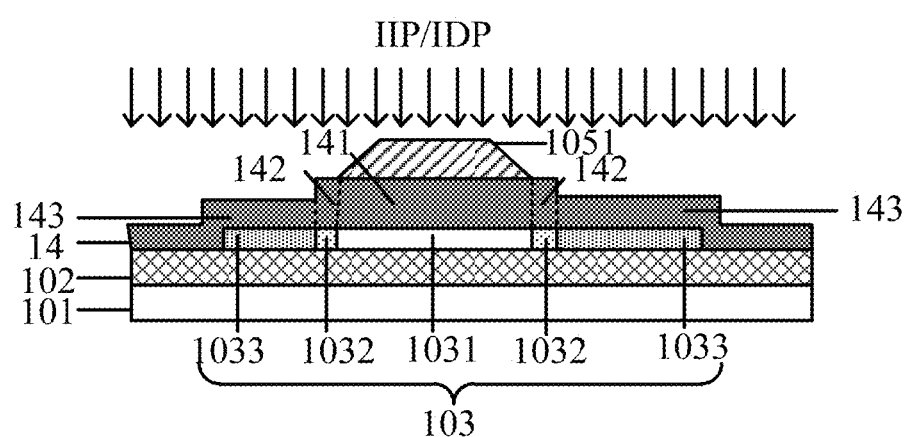

As shown in FIG. 3D, after the gate electrode 1051 is formed on the gate insulating layer 14, the active layer pattern 1030 is doped with ions by using the gate electrode 1051 as a mask to form a channel region 1031, a lightly doped drain region 1032, and a source/drain region 1033 within the active layer pattern 1030. In the direction perpendicular to the base substrate 101, the channel region 1031 overlaps the first portion 141 of the gate insulating layer 14 and the gate electrode 1051; the lightly doped drain region 1032 overlaps the second portion 142 of the gate insulating layer 14 and is located between the source region 10331 and the channel region 1031 and between the drain region 10332 and the channel region 1031, with the source/drain region 1033 overlapping the third portion 143 of the gate insulating layer 14. The specific forming process can be described with reference to FIG. 1E and will not be described here.

Figure 3E:
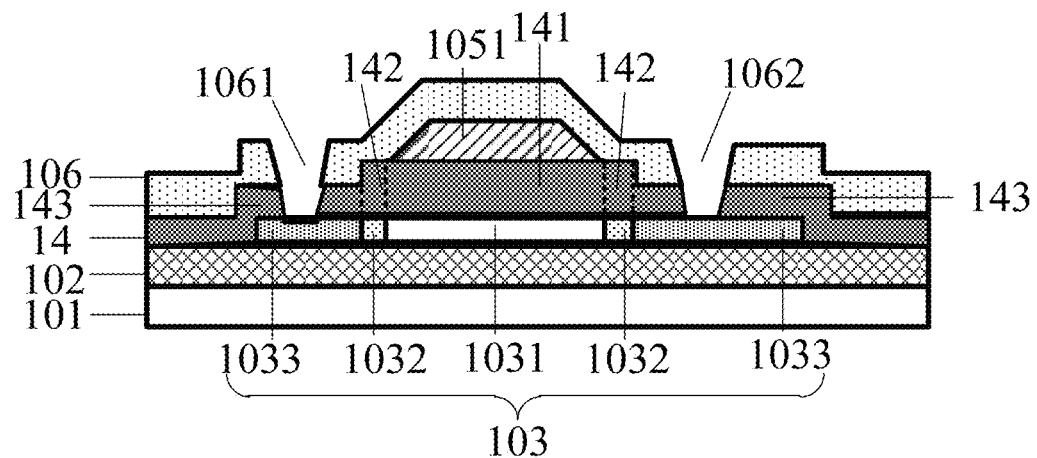
Figure 3F:
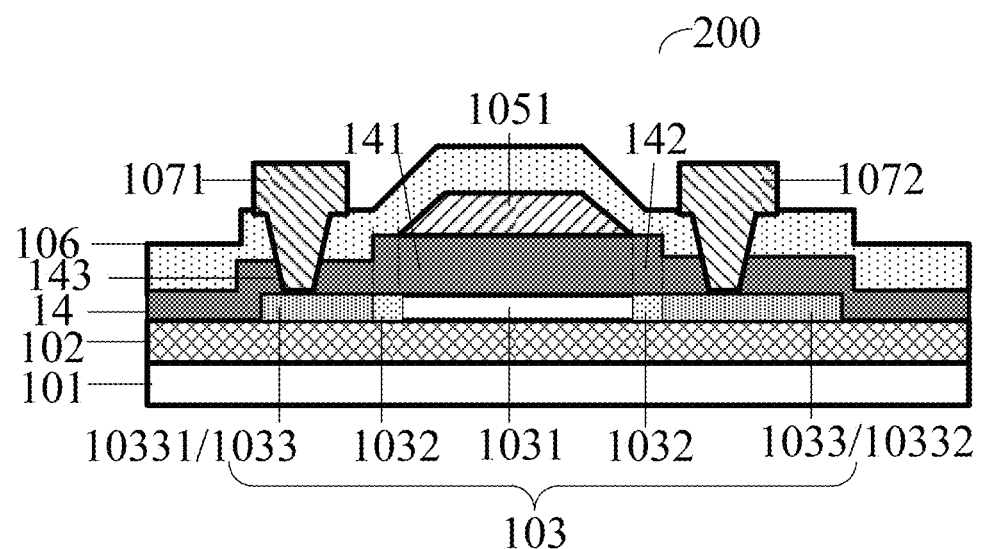

For example, as shown in FIG. 3E to FIG. 3F, an interlayer insulating layer 106 is formed on the gate electrode 1051, and a source electrode 1071 and a drain electrode 1072 are formed on the interlayer insulating layer 106, thereby constituting the thin film transistor 200.

In the thin film transistor 200 provided in this embodiment, by designing the pattern of the gate insulating layer 14, the gate insulating layer 14 includes a first portion 141, a second portion 142, and a third portion 143, and the thickness of the second portion 142 is greater than the thickness of the third portion 143. At the same time, in connection with the depth adjustment of the ion implantation process, the formation of the lightly doped drain region 1032 and the source/drain region 1033 in the thin film transistor can be realized under the same ion doping conditions. The lightly doped drain region 1032 overlaps with the second portion 142, and the source/drain region 1033 overlaps with the third portion 143. The method provided by the embodiment forms the lightly doped drain region 1032 in the thin film transistor, thus simplifying the manufacturing process and reducing the production costs. Furthermore, by forming the lightly doped drain region 1032 in the thin film transistor 200, the leakage current of the thin film transistor is effectively reduced, thereby effectively improving the contrast of the array substrate including the thin film transistor as the switching element of a sub-pixel unit and improving the display quality of the array substrate.

Figure 4:
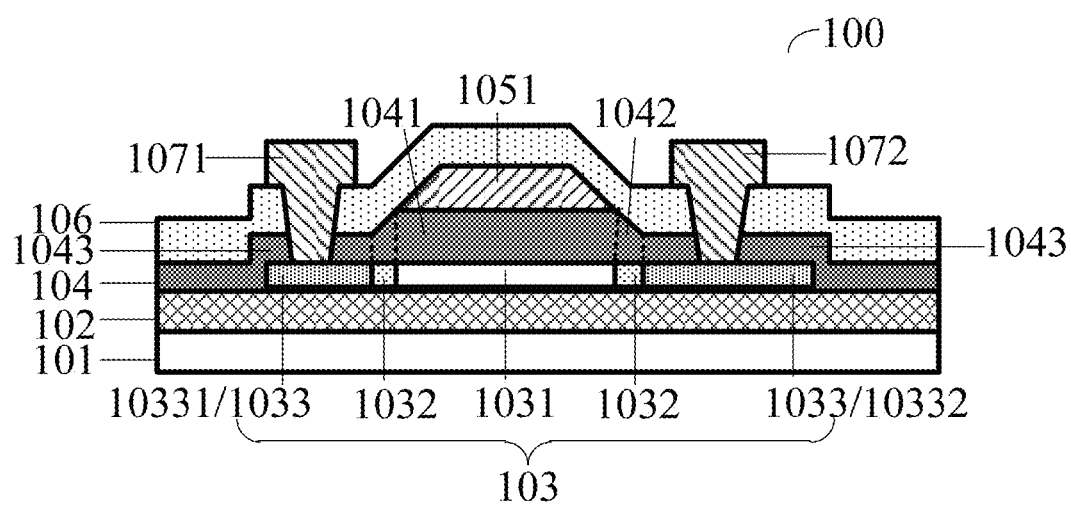
FIG. 4 shows a schematic cross-sectional structure of a thin film transistor according to another embodiment of the present disclosure.

Another embodiment of the present disclosure provides a thin film transistor 100, and FIG. 4 shows a schematic cross-sectional structure of the thin film transistor provided according to this embodiment.

Referring to FIG. 4, the thin film transistor 100 includes an active layer structure 103, a gate insulating layer 104, a gate electrode 1051 and other structures on a base substrate 101.

As shown in FIG. 4, the active layer structure 103 includes a channel region 1031, a lightly doped drain region 1032, and a source/drain region 1033. The source/drain region 1033 includes a source region 10331 and a drain region 10332. The lightly doped drain region 1032 is located between the source region 10331 and the channel region 1031 and between the drain region 10332 and the channel region 1031. In this embodiment, examples of materials for the active layer structure 103 include amorphous silicon, polysilicon, metal oxide semiconductor materials such as IGZO or any other suitable materials, and doped ions for forming the lightly doped drain region 1032 and the source/drain region 1033 may include, for example, N-type ions (e.g., phosphorus ions) or P-type ions (e.g., boron ions), etc.

As shown in FIG. 4, the gate insulating layer 104 includes a first portion 1041 on the active layer structure 103, a third portion 1043 on both sides of the first portion 1041, and a second portion 1042 between the first portion 1041 and the third portion 1043 on at least one side. In this embodiment, the second portion 1042 is located between the first portion 1041 and the third portion 1043 on each side. That is, the second portion 1042 is between the first portion 1041 and the third portion 1043 on both sides of the first portion. Of course, the positional relationship of the second portion 1042 is not limited to this. For example, in another example of this embodiment, the second portion 1042 may also be between the first portion 1041 and the third portion 1043 on one side of the first portion. In the direction perpendicular to the base substrate 101, the lightly doped drain region 1032 overlaps with the second portion 1042, the source/drain region 1033 overlaps with the third portion 1043, and the size of the second portion 1042 in the direction perpendicular to the base substrate 101 is larger than the size of the third portion 1043 in the direction perpendicular to the base substrate 101. In this embodiment, examples of materials for the gate insulating layer/gate insulating layer film include SiNx, SiOx or other suitable materials, and this embodiment is not limited thereto.

For example, the gate electrode 1051 is disposed on the gate insulating layer 104 and overlaps with the first portion 1041. For example, the gate electrode 1051 is located directly above the first portion 1041 of the gate insulating layer 104. For example, the gate electrode 1051 is located only above the first portion 1041. For example, the gate electrode 1051 is not located directly above the second portion 1042 and the third portion 1043. For example, when performing an ion implantation process, the first portion 1041 is shielded by the gate electrode 1051, and the second portion 1042 and the third portion 1043 are exposed, so that the portion of the active layer pattern 1030 directly opposite to the first portion 1041 is not doped with doping ions, while the portions of the active layer pattern 1030 directly opposite to the second portion 1042 and the third portion 1043 are doped with doping ions. Examples of materials for the gate electrode 1051 include aluminum, aluminum alloy, copper, copper alloy or other suitable materials, and this embodiment is not limited thereto.

As shown in FIG. 4, the thin film transistor 100 may further include, for example, a buffer layer 102, an interlayer insulating layer 106, a source electrode 1071, a drain electrode 1072, and the like.

The base substrate 101 may be, for example, a glass substrate, a quartz substrate, a plastic substrate, or a base substrate of other suitable materials.

As shown in FIG. 4, a buffer layer 102 is disposed on the base substrate 101 and located between the base substrate 101 and the active layer structure 103. The buffer layer 102 can, for example, prevent impurity ions in the base substrate 101 from diffusing into circuit layers including thin film transistors and the like, and prevent influence on characteristics such as threshold voltage and leakage current of thin film transistor elements. Meanwhile, the buffer layer 102 can also planarize the surface of the base substrate 101, for example. Examples of materials for the buffer layer 102 include SiNx, SiOx or other suitable materials, and this embodiment is not limited thereto.

For example, an interlayer insulating layer 106 is disposed on the base substrate 101 and covers the gate electrode 1051, the gate insulating layer 104, and the active layer structure 103. The interlayer insulating layer 106 has via holes exposing the source/drain regions 1033. Examples of materials for the interlayer insulating layer 106 include SiNx, SiOx, or other suitable materials.

For example, a source electrode 1071 and a drain electrode 1072 are disposed on the interlayer insulating layer 106, and the source electrode 1071 is electrically connected to the source region 10331 of the active layer structure 103 through a via hole of the interlayer insulating layer 106, while the drain electrode 1072 is disposed opposite to the source 1071 and is electrically connected to the drain region 10332 of the active layer structure 103 through a via hole of the interlayer insulating layer 106. Examples of materials for the source electrode 1071 and/or drain electrode 1072 include aluminum, aluminum alloy, copper, copper alloy, or other suitable materials.

In the thin film transistor 100 provided in this embodiment, the gate insulating layer 104 is formed using the gate electrode 105 as a mask, the gate insulating layer 104 includes a first portion 1041, a second portion 1042, and a third portion 1043, and the thickness of the second portion 1042 is greater than that of the third portion 1043 (i.e., the size of the second portion 1042 in the direction perpendicular to the base substrate is larger than the size of the third portion 1043 in the direction perpendicular to the base substrate). At the same time, in cooperation with the depth adjustment of the ion implantation process, a lightly doped drain region 1032 and a source/drain region 1033 can be realized in the thin film transistor under the same ion doping conditions. The lightly doped drain region 1032 overlaps with the second portion 1042, and the source/drain region 1033 overlaps with the third portion 1043. According to the method provided by the embodiments, in the same ion implantation process, the lightly doped drain region 1032 and the source/drain region 1033 are simultaneously formed in the thin film transistor, thus simplifying the manufacturing process and reducing the production cost. Furthermore, by forming the lightly doped drain region 1032 in the thin film transistor 100, the leakage current of the thin film transistor is effectively reduced, thereby effectively improving the contrast of the array substrate including the thin film transistor as the switching element of a sub-pixel unit and improving the display quality of the array substrate.

Figure 5:
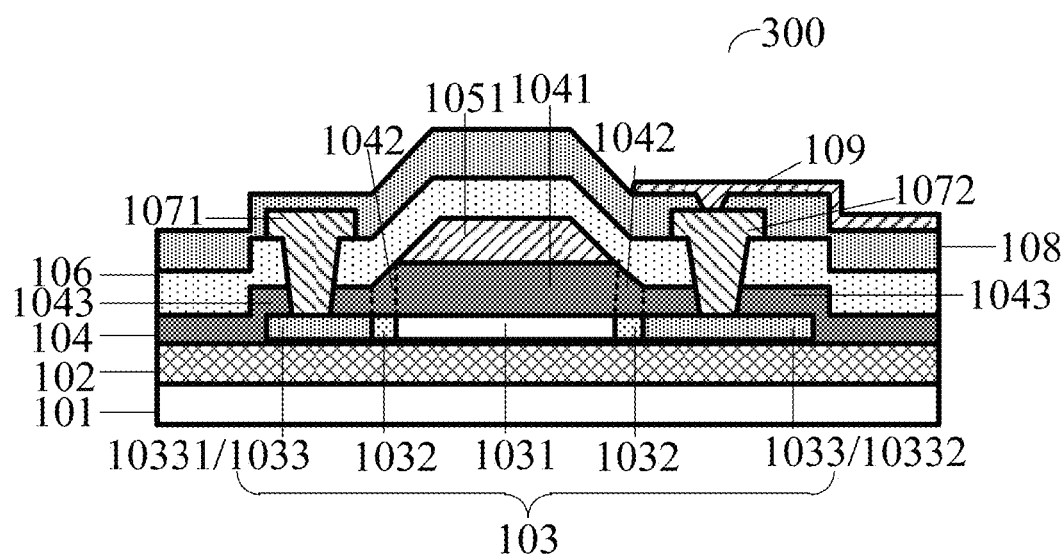
FIG. 5 shows a schematic cross-sectional structure of an array substrate provided according to another embodiment of the present disclosure.

As shown in FIG. 1G, FIG. 4 and FIG. 5, at least an embodiment of the present disclosure provides a thin film transistor including:

a base substrate 101;

an active layer structure 103 located on the base substrate 101, the active layer structure 103 including a source region 10331, a drain region 10332, and a lightly doped drain region 1032;

a gate insulating layer 104 on the active layer structure 103, the gate insulating layer 104 including an opposing portion 014 directly opposite to the active layer structure 103, the opposing portion 014 including a first portion 1041, a second portion 1042, and a third portion 1043, the third portion 1043 being on both sides of the first portion 1041, the second portion 1042 being between the first portion 1041 and the third portion 1043 on at least one side, and the second portion 1042 having a larger dimension in the direction perpendicular to the base substrate 101 than the third portion 1043 in the direction perpendicular to the base substrate 101; and a gate electrode 1051 located on the side of the gate insulating layer 104 away from the base substrate 101 and is directly opposite to the first portion 1041.

As shown in FIG. 2 and FIG. 3F, at least an embodiment of the present disclosure provides a thin film transistor, including:

a base substrate 101;

an active layer structure 103 located on the base substrate 101, the active layer structure 103 including a source region 10331, a drain region 10332, and a lightly doped drain region 1032;

a gate insulating layer 14 located on the active layer structure 103, the gate insulating layer 14 including an opposing portion 014 directly opposite to the active layer structure 103, the opposing portion 014 including a first portion 1041, a second portion 1042, and a third portion 1043, the third portion 1043 being on both sides of the first portion 1041, the second portion 1042 being between the first portion 1041 and at least one side of the third portion 1043, the second portion 1042 having a larger dimension in the direction perpendicular to the base substrate 101 than the third portion 1043 in the direction perpendicular to the base substrate 101; and a gate electrode 1051 located on the side of the gate insulating layer 104 away from the base substrate 101 and is opposite to the first portion 1041.

Another embodiment of the present disclosure provides an array substrate 300 including the thin film transistor structure of any embodiment of the present disclosure. FIG. 5 shows a schematic cross-sectional structure of the array substrate provided according to this embodiment. For example, the array substrate 300 may be various types of array substrates, such as an array substrate of a liquid crystal display device or a base substrate of an organic light emitting diode display device. The array substrate of the liquid crystal display device includes, for example, a vertical electric field type array substrate, a horizontal electric field type array substrate, and the like. The embodiments are not limited to the specific type of array substrate.

Referring to FIG. 5, the array substrate 300 may include, for example, a thin film transistor, a passivation layer 108, a pixel electrode 109, and the like. For example, in the array substrate 300, the thin film transistor acts like a switch element, and under the control of the gate electrode 1051, an external data signal can be charged and discharged to the pixel electrode 109 in the array substrate 300 through the thin film transistor, for example.

As shown in FIG. 5, the passivation layer 108 is disposed on the interlayer insulating layer 106 and has via holes. Examples of materials for the passivation layer 108 include SiNx, SiOx, or other suitable materials.

As shown in FIG. 5, the pixel electrode 109 is disposed above the passivation layer 108 and electrically connected to the drain 1072 through a via hole of the passivation layer 108, for example. Of course, this embodiment includes but is not limited to this. For example, the pixel electrode 109 may also be electrically connected to the source 1071. Examples of materials for the pixel electrode 109 include molybdenum, molybdenum alloy, titanium, titanium alloy, Indium Tin Oxide (ITO), Indium Zinc Oxide (IZO), or other suitable materials, and this embodiment is not limited thereto.

It should be noted that the present disclosure does not give the entire structure of the array substrate 300 for the sake of clarity. For example, the array substrate may also include a common line, a common electrode, a plurality of gate lines, a plurality of data lines, etc. as required, wherein the plurality of gate lines and the plurality of data lines cross each other to define a plurality of sub-pixel units, and each sub-pixel unit may include, for example, a thin film transistor as a switching element and a pixel electrode 109, etc. In order to realize the necessary functions of the array substrate, those skilled in the art can provide other structures not shown according to specific application scenarios, and the embodiments of the present disclosure are not limited to this.

In the array substrate 300 provided in the embodiments, the array substrate 300 includes the thin film transistor structure described in any of the above embodiments, the gate insulating layer in the thin film transistor includes a first portion, a second portion, and a third portion, and the thickness of the second portion is greater than the thickness of the third portion (i.e., the size of the second portion in the direction perpendicular to the base substrate is greater than the size of the third portion in the direction perpendicular to the base substrate), at the same time, in cooperation with the depth adjustment of the ion implantation process, the lightly doped drain region 1032 and the source/drain region 1033 in the thin film transistor can be simultaneously formed under the same ion doping conditions. The lightly doped drain region 1032 overlaps with the second portion, and the source/drain region 1033 overlaps with the third portion. The method provided by the embodiment forms the lightly doped drain region 1032 in the thin film transistor, thus simplifying the manufacturing process and reducing the production cost. Furthermore, by forming lightly doped drain region 1032 in the thin film transistor, the leakage current of the thin film transistor is effectively reduced, thereby effectively improving the contrast of the array substrate and improving the display quality of the array substrate.

This embodiment also provides an electronic device including the thin film transistor described in any of the above embodiments.

Figure 6:
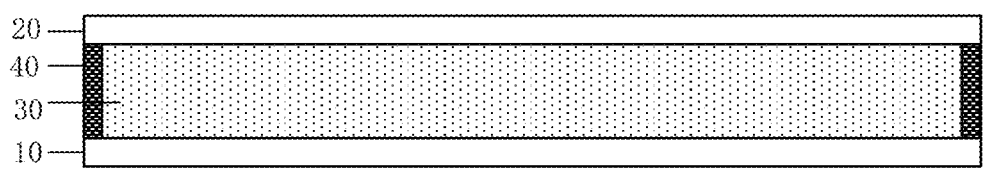
FIG. 6 shows a schematic diagram of a display device provided according to another embodiment of the present disclosure.

For example, an example of the electronic device is a liquid crystal display device. As shown in FIG. 6, the liquid crystal display device includes an array substrate 10, an opposing substrate 20, a liquid crystal material 30, a frame sealant 40, and other structures. The array substrate 10 and the opposing substrate 20 face each other and are bonded to each other by a frame sealant 40 to form a liquid crystal cell filled with a liquid crystal material 30. The opposing substrate 20 is, for example, a color filer substrate. The thin film transistor of each sub-pixel unit of the array substrate 10 is used to apply a data signal to the pixel electrode therein, thereby applying an electric field to control the degree of rotation of the liquid crystal material 30 to perform a display operation.

For example, another example of the electronic device is an organic electroluminescent display device (OLED), in which an organic light emitting material stacked layer is formed on an array substrate of the OLED, and a thin film transistor of each sub-pixel unit can charge and discharge a pixel electrode in the sub-pixel, thereby controlling a driving current for driving the thin film transistor to drive the OLED to emit light. Here, the pixel electrode in the sub-pixel unit can be used as the cathode or anode of the OLED.

For example, another example of the electronic device is an electronic paper display device, an electronic ink layer is formed on an array substrate of the electronic paper display device, and thin film transistors of each sub-pixel unit are used to charge and discharge pixel electrode in the sub-pixel, thereby applying a voltage that drives charged microparticles in the electronic ink to move to perform a display operation.

The electronic device can also include televisions, digital cameras, mobile phones, watches, tablet computers, notebook computers, navigators and other products or components including thin film transistor structures. The technical effects of the electronic device can be seen in the technical effects of the thin film transistor described in the above embodiments and the array substrate described in this embodiment, and will not be repeated here.

Without conflict, the embodiments of the present disclosure and the features in the embodiments can be combined with each other to obtain new embodiments.

The above description is only a specific embodiment of the present disclosure, but the scope of protection of the present disclosure is not limited to this. Any person familiar with the technical field can easily think of changes or substitutions within the technical scope of the present disclosure, and should be covered within the scope of protection of the present disclosure. Therefore, the scope of protection of the present disclosure should be based on the scope of protection of the claims.

What is claimed is:

1. A method of manufacturing a thin film transistor, comprising:
   forming an active layer pattern on a base substrate;
   forming a gate insulating layer on the active layer pattern, the gate insulating layer comprising a first portion, a second portion, and a third portion, the third portion being on both sides of the first portion, the second portion being between the first portion and the third portion on at least one side, and a thickness of the second portion being greater than a thickness of the third portion;
   forming a gate electrode located at a side of the gate insulating layer far from the base substrate; and
   performing an ion doping process on the active layer pattern using the gate electrode as a mask under a same ion doping condition,
   wherein orthographic projections of the first portion, the second portion, and the third portion on the base substrate coincide with an orthographic projection of the active layer pattern on the base substrate; an orthographic projection of the first portion coincides with an orthographic projection of the gate electrode on the base substrate;
   wherein a slope angle of the second portion immediately adjacent to a side edge of the gate electrode is substantially equal to a slope angle of the side edge of the gate electrode.

2. The method according to claim 1, wherein in the ion doping process, a part of the active layer pattern, an orthographic projection of which on the base substrate coincides with the third portion, is converted into a source region and a drain region, and a part of the active layer pattern, an orthographic projection of which on the base substrate coincides with the second portion, is converted into a lightly doped drain region.

3. The method according to claim 2, wherein the source region, the drain region and the lightly doped drain region are formed simultaneously in the ion doping process.

4. The method according to claim 2, wherein in the ion doping process, a part of the active layer pattern, an orthographic projection of which on the base substrate coincides with the first portion, forms a channel region.

5. The method according to claim 2, wherein the forming the gate insulating layer and the gate electrode on the active layer pattern comprises:
   forming a gate insulating layer film on the active layer pattern;
   forming the gate electrode on the gate insulating film; and using the gate electrode as a mask, etching the gate insulating film to form the gate insulating layer comprising the first portion, the second portion, and the third portion.

6. The method according to claim 5, wherein the gate insulating film is etched using the gate electrode as the mask under a condition that a photoresist pattern for forming the gate electrode is retained on the gate electrode.

7. The method according to claim 2, further comprising:
forming a source electrode which is electrically connected with the source region; and
forming a drain electrode opposite to the source electrode and electrically connected to the drain region.

8. The method according to claim 1, wherein the forming the gate insulating layer on the active layer pattern comprises:
forming a gate insulating layer film on the active layer pattern; and
patterning the gate insulating layer film by a photolithography process to form the gate insulating layer comprising the first portion, the second portion, and the third portion.

9. The method according to claim 1, wherein the second portion comprises a slope portion inclined from the first portion to the third portion.

10. The method according to claim 1, wherein the second portion comprises a stepped portion extending from the first portion to the third portion.

11. The method according to claim 1, wherein a thickness of the second portion is less than or equal to a thickness of the first portion.

12. A thin film transistor comprising:
a base substrate;
an active layer structure located on the base substrate;
a gate insulating layer on the active layer structure, the gate insulating layer comprising a first portion, a second portion, and a third portion, the third portion being on both sides of the first portion, the second portion being between the first portion and the third portion on at least one side, and a thickness of the second portion being greater than a thickness of the third portion; and
a gate electrode, wherein the gate electrode is located on a side of the gate insulating layer far from the base substrate, and an orthographic projection of the gate electrode coincides with an orthographic projection of the first portion on the base substrate,
wherein a slope angle of the second portion immediately adjacent to a side edge of the gate electrode is substantially equal to a slope angle of the side edge of the gate electrode.

13. The thin film transistor according to claim 12, wherein orthographic projections of the first portion, the second portion, and the third portion on the base substrate coincide with an orthographic projection of the active layer structure on the base substrate.

14. The thin film transistor according to claim 12, wherein the active layer structure comprises a source region, a drain region and a lightly doped drain region, an orthographic projection of the source region and the drain region on the base substrate coincides with an orthographic projection of the third portion on the base substrate, and an orthographic projection of the lightly doped drain region on the base substrate coincides with an orthographic projection of the second portion on the base substrate.

15. The thin film transistor according to claim 12, wherein the active layer structure further comprises a channel region, and the channel region coincides with an orthographic projection of the gate electrode on the base substrate.

16. The thin film transistor according to claim 12, wherein the second portion comprises a slope portion inclined from the first portion to the third portion, or the second portion comprises a stepped portion extending from the first portion to the third portion.

17. The thin film transistor according to claim 12, wherein a thickness of the second portion is less than or equal to a thickness of the first portion.

18. An array substrate comprising the thin film transistor according to claim 12.

19. An electronic device comprising the thin film transistor according to claim 12.

20. A method of manufacturing a thin film transistor, comprising:
forming an active layer pattern on a base substrate;
forming a gate insulating layer on the active layer pattern, the gate insulating layer comprising a first portion, a second portion, and a third portion, the third portion being on both sides of the first portion, the second portion being between the first portion and the third portion on at least one side, and a thickness of the second portion being greater than a thickness of the third portion;
forming a gate electrode located at a side of the gate insulating layer far from the base substrate; and
performing an ion doping process on the active layer pattern using the gate electrode as a mask under a same ion doping condition,
wherein orthographic projections of the first portion, the second portion, and the third portion on the base substrate coincide with an orthographic projection of the active layer pattern on the base substrate; an orthographic projection of the first portion coincides with an orthographic projection of the gate electrode on the base substrate;
wherein the ion doping process is performed by controlling an ion implantation dose and an ion implantation depth so that a peak position of the ion implantation dose does not exceed a region of the active layer pattern overlapping the third portion,
wherein a slope angle of the second portion immediately adjacent to a side edge of the gate electrode is substantially equal to a slope angle of the side edge of the gate electrode.

* * * * *